United States Patent
Da Rocha Mordente et al.

(10) Patent No.: US 10,294,890 B2
(45) Date of Patent: May 21, 2019

(54) SLIDING COMBINATION FOR USE IN AN INTERNAL COMBUSTION ENGINE

(71) Applicants: Mahle Metal Leve S/A, Jundiai (BR); Mahle International GmbH, Stuttgart (DE)

(72) Inventors: Paulo Jose Da Rocha Mordente, Sao Paulo (BR); Edney Deschauer Rejowski, Sao Paulo (BR); Robert Richard Banfield, Sao Paulo (BR); Jose Valentim Lima Sarabanda, Sao Paulo (BR)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 202 days.

(21) Appl. No.: 15/101,354

(22) PCT Filed: Nov. 21, 2014

(86) PCT No.: PCT/EP2014/075290
§ 371 (c)(1),
(2) Date: Jun. 2, 2016

(87) PCT Pub. No.: WO2015/082235
PCT Pub. Date: Jun. 11, 2015

(65) Prior Publication Data
US 2016/0305366 A1    Oct. 20, 2016

(30) Foreign Application Priority Data

Dec. 3, 2013   (BR) .................. 10 2013 031072 7

(51) Int. Cl.
*F02F 11/00* (2006.01)
*F16J 9/26* (2006.01)
(Continued)

(52) U.S. Cl.
CPC ........ *F02F 11/005* (2013.01); *C23C 14/0605* (2013.01); *F02F 1/004* (2013.01); *F16J 9/26* (2013.01)

(58) Field of Classification Search
CPC ... F02F 11/005; F02F 1/004; F02F 1/18; F16J 9/26; C23C 14/0605
(Continued)

(56) References Cited

U.S. PATENT DOCUMENTS 7,726,273 B2 *   6/2010   Azevedo .................. F02F 1/20
                                                                     123/193.2
9,809,885 B2 *   11/2017   Hoppe .................... C23C 30/00
(Continued)

FOREIGN PATENT DOCUMENTS

EP         2578908 A1      4/2013

*Primary Examiner* — Syed O Hasan
(74) *Attorney, Agent, or Firm* — Fishman Stewart PLLC

(57) ABSTRACT

A sliding combination for use in an internal combustion engine may include at least one cylinder liner defining an internal sliding surface and a ring having an external lateral sliding surface. The external sliding surface of the ring may slide in relation to the internal sliding surface of the liner. The external sliding surface of the ring may include a first coating of a physical vapor deposited metal nitride in sliding contact with a second coating of a diamond-like carbon (DLC) material disposed on the internal sliding surface of the liner.

12 Claims, 2 Drawing Sheets

(51) Int. Cl.
    *C23C 14/06* (2006.01)
    *F02F 1/00* (2006.01)
(58) Field of Classification Search
    USPC .................................................... 123/193.2
    See application file for complete search history.

(56) References Cited

U.S. PATENT DOCUMENTS

2006/0269790 A1* 11/2006 Sarabanda ............ C23C 14/025
                                                    428/698
2013/0199503 A1*  8/2013 Callahan .................. F16J 10/04
                                                    123/51 R

* cited by examiner

SLIDING COMBINATION FOR USE IN AN INTERNAL COMBUSTION ENGINE

CROSS-REFERENCE TO RELATED APPLICATIONS

This application claims priority to Brazilian Patent Application No. 10 2013 031072 7, filed Dec. 3, 2013, and International Patent Application No. PCT/EP2014/075290, filed Nov. 21, 2014, both of which are hereby incorporated by reference in their entirety.

TECHNICAL FIELD

The present invention relates to a sliding combination formed by at least one piston ring and one cylinder liner, the at least one ring having a coating of metal nitride applied by the physical vapour deposition (PVD) process and the cylinder liner has a diamond-like carbon (DLC) coating. The resultant sliding combination provides greater resistance to wear in comparison with the current solutions, which are very often focused on the improvement of solely one of the elements of the combination.

BACKGROUND

In an internal combustion engine, the friction existing between the cylinder liner and the piston rings is widely studied because the reduction thereof is crucial to optimise the functioning of engines, improving performance, reducing the consumption of fuel and decreasing the burning of lubricating oil present on the cylinder wall.

A paradigm current until very recently was that wherein the improvement was sought of each component individually. Consequently, research workers developed new improvements (such as, for example, base materials and coatings) for rings and cylinder liners, in terms of the properties of each one thereof. A systematic study having the objective of optimising the performance of more than one component of the combustion cell was uncommon.

Consequently, in many situations the development of a piston ring having a certain coating being very efficient in terms of wear did not provide economic benefits by virtue of the fact that the said new coating did not perform satisfactorily in the cylinder liners in use.

The great majority of cylinder liners currently in existence are produced in cast iron, a material with excellent properties in terms of tribological compatibility with the rings and the skirts of the piston. This compatibility arises from the fact that cast iron has, naturally, particles of free carbon (graphite) which, by virtue of being a solid lubricant, contributes to the reduction of dynamic friction and, by inference, to the greater durability of the said components.

Recently, with the increase in pressure for a reduction in consumption and pollution by engines brought about by increasingly restrictive pollutant control legislation, engine designers have made use of solutions such as supercharging at increasingly high pressures and new strategies for pollution reduction, such as the utilisation of exhaust gas recirculation (EGR) systems.

These solutions have taken the liners of cast iron to what appears to be the limit of tribological application by virtue of the fact that the said components have demonstrated accelerated wear in these new engines, in particular in the region of the top dead centre (TDC).

As a consequence, the aforementioned increase in pressures to reduce consumption and pollution by engines, as a result of increasingly restrictive pollutant control legislation, has brought about the need for a paradigm change and manufacturers have started thinking about the joint development of rings and liners in a systematic manner, going on to develop new sliding pairs.

A first fruit of this joint approach may be found in international patent application WO2009/069703 which refers to the combined structure of a piston ring and a cylinder liner of an internal combustion engine. The combined structure comprises: (i) a cylinder liner, the sliding surface whereof has an average roughness, taken at 10 different points, of 0.5 µm to 1.0 µm, an effective load roughness (Rk) of 0.2 µm to 0.4 µm, an initial wear height (Rpk) of between 0.05 µm and 0.1 µm, and an oil sump depth (Rvk) of between 0.08 µm and 0.2 µm; and (ii) a piston ring, the external lateral face whereof has an average roughness, taken at 10 different points, of 1.6 µm or less, and an initial wear height of less than 0.3 µm. Furthermore, the piston ring should exert a pressure on the cylinder liner of the order of 0.03 MPa to 0.2 MPa.

The patent document JP2004116707 refers to a combined sliding member formed by a piston ring and a cylinder liner. The piston ring comprises a sliding surface having a roughness Rz of 0.5 µm to 1.0 µm and the cylinder liner has a roughness Rz of 0.5 µm to 1.5 µm, an initial wear height of 0.05 µm to 0.2 µm (based on the standard DIN 4776), an effective load roughness (Rk) of 0.2 µm to 0.6 µm, and an oil sump depth (Rvk) of 0.10 µm to 0.35 µm.

The external lateral surface of the piston ring is formed of a layer of metallic chromium, a laminated layer of metallic chromium, a nitrided layer or a layer applied by the physical vapour deposition (PVD) process. The surface of the cylinder liner, in turn, is preferably formed of cast iron, cast iron with boron or cast steel.

Finally, the Japanese patent document JP2003254156 refers to the combination of a cylinder and a piston ring, wherein there occurs a low degree of sliding friction, reduced scuffing wear, and a reduction in the loss of the combustion gases through the passage between the rings and the sliding surface of the liner and burning lubricating oil (blow by). The cylinder is made from an alloy based on aluminium and the piston ring has a base of austenitic stainless steel, the external lateral surface being coated by a film of hard chromium constituted by two or more layers wherein microcracks are distributed, each thereof including a part which opens at the external surface and has a depth corresponding to the layer itself remaining and extending partially in the direction of a deeper layer. This constitution ensures an excellent degree of oil retention in these microcracks, ensuring the durability and reducing the consumption of lubricant through blow by.

There had still not been developed a sliding combination achieving the desired gains of durability and strength through the use of a ring with a metal nitride coating applied by the physical vapour deposition (PVD) process and a cylinder liner with a DLC (diamond-like carbon) coating. Studies carried out by the applicant demonstrate that the utilisation of other types of coating on the piston ring, such as chromium ceramic or chromium nitride applied by the thermospray process did not provide the expected results.

SUMMARY

The present invention has the objective of providing a sliding combination achieving increases in durability and strength through the use of a ring having a coating of metal nitride applied by the physical vapour deposition (PVD) process and a cylinder liner having a coating of DLC (diamond-like carbon).

More specifically, the present invention has the objective of providing a sliding combination wherein the compression ring has a coating of CrN, CrCN/C or TiN and the liner has a coating of DLC (diamond-like carbon).

The present invention moreover has the objective of providing a sliding combination achieving increases in durability and strength without the counterpart of an increase in the manufacturing cost thereof which would render it economically unviable.

The objectives of the present invention are achieved by a sliding combination for use in an internal combustion engine, comprising at least one cylinder liner of cylindrical shape defining an internal sliding surface and a ring defined by at least one external lateral sliding surface, the external sliding surface of the ring sliding in relation to the internal surface of the liner, wherein the surface of the ring has a first coating of metal nitride applied by the physical vapour deposition (PVD) process which slides over a second coating of DLC (diamond-like carbon) applied over the internal surface of the liner.

BRIEF DESCRIPTION OF THE DRAWINGS

The present invention will be described below in greater detail, based on an example of embodiment shown in the drawings. In the figures.

DETAILED DESCRIPTION

Figure 1:
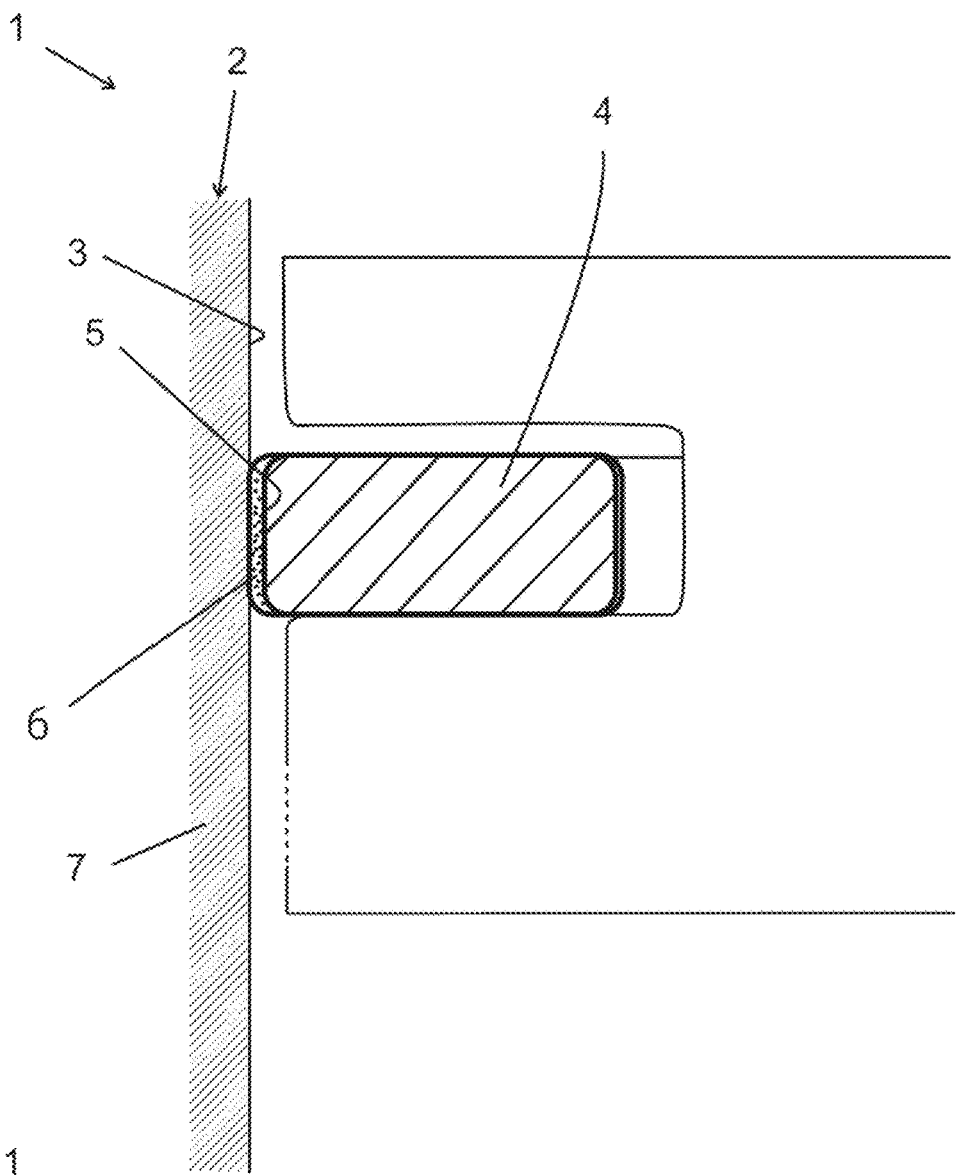
FIG. 1 is a cross sectional schematic view of the region of the upper groove (1 to 3) of the sliding combination of the present invention.

The sliding combination 1 of the present invention has been developed as a response to the increasingly severe requirements for increase in performance and reduction in consumption and emission of pollutants to which internal combustion engines are subject.

The sliding combination 1 of the present invention comprises at least one cylinder liner 2 of substantially cylindrical shape defining an internal sliding surface 3 and a ring 4 defining at least one external lateral sliding surface 5, such that the external lateral surface 5 of the ring 4 slides in relation to the internal surface 3 of the liner 2.

The ring 4 is preferably a first groove ring or compression ring, however it is clear that it may assume any other possible configuration such as, for example, a second groove ring or even an oil scraper ring, without the resulting invention ceasing to be included within the scope of protection of the appended claims. In the same manner, the specific geometry thereof is irrelevant in terms of the scope of protection. Finally, the base material constituting the ring may vary freely, provided that it permits the application of a coating which shall be detailed below. The ring 4 is preferably constituted by cast iron or stainless steel.

The cylinder liner 2, in turn, may also assume diverse specific configurations having internal diameters and an external perimeter which may vary freely, recalling that this latter presents, as a rule, elements which facilitate the affixing thereof to the engine block (these not being illustrated). The base material of the liner is preferably, but not obligatorily, cast iron, the specific composition whereof may vary as a function of design and operational parameters of the engine wherein it will be installed.

Any other materials may be utilised provided that they are functional such as, for example, cast steel, without the resulting liner ceasing to be included within the scope of protection of the claims.

Whatever the specific constitutions may be of the ring 4 and of the liner 2, the surface 5 of the ring has a first coating 6 of metal nitride applied by the physical vapour deposition (PVD) process which slides over a second coating 7 of DLC (diamond-like carbon) applied over the internal surface 3 of the liner 2. In this manner it is clear that the material constituting the ring and the liner may freely vary provided that they render viable the application of the respective coatings.

Following diverse studies, the applicant has observed that the isolated study of the piston ring and of the liner was insufficient to ensure the two in operation when the ring slides axially within the interior of the liner over the billions of cycles of operation of the engine.

The various layers 5, 5' of the coating 3 are applied by a process known by those skilled in the art as physical vapour deposition (PVD).

It should be noted that the physical vapour deposition process involves purely physical processes, such as high temperature, vacuum evaporation or plasma bombardment. Furthermore, a gas may be added such as, for example, nitrogen ($N_2$), such that this combines with the metallic material which is being deposited to form nitrides. Among the processes employed to evaporate the metallic material from the source (target cathode), one of the most well known is the cathodic arc wherein a high power electric arc is directed at the material source, evaporating it and generating ions which are deposited on the part. In the presence of gases such as nitrogen ($N_2$), the nitride of the metallic material is deposited on the part.

That is to say, the process of deposition by cathodic arc is a technique of physical vapour deposition wherein an electric arc is employed to vaporise material from a target cathode. The vaporised material then condenses on a substrate, forming a thin film.

In essence, control of the pressure of the nitrogen ($N_2$) gas and of the vaporised metal permits precise control of the coating which it is desired to obtain. In the case of the present invention, the coating 6 of the ring 4 is preferably composed of CrN, CrCN/C or TiN, it being more preferably composed of CrN.

The coating 6 of the ring 4 preferably has a hardness of between 1000 HV and 2300 HV, a thickness exceeding (>) 5 µm, preferably between 20 µm and 40 µm, and presents columnar morphology.

The coating 7 of the liner 2 has a hardness of between 10 GPa and 20 GPa, a thickness exceeding (>) 1 µm, preferably between 2 µm and 15 µm, and presents gradient morphology.

The present sliding pair displays a more reduced wear of the components thereof, thus ensuring greater durability of engines within the original parameters or functional principles thereof.

Figure 2:
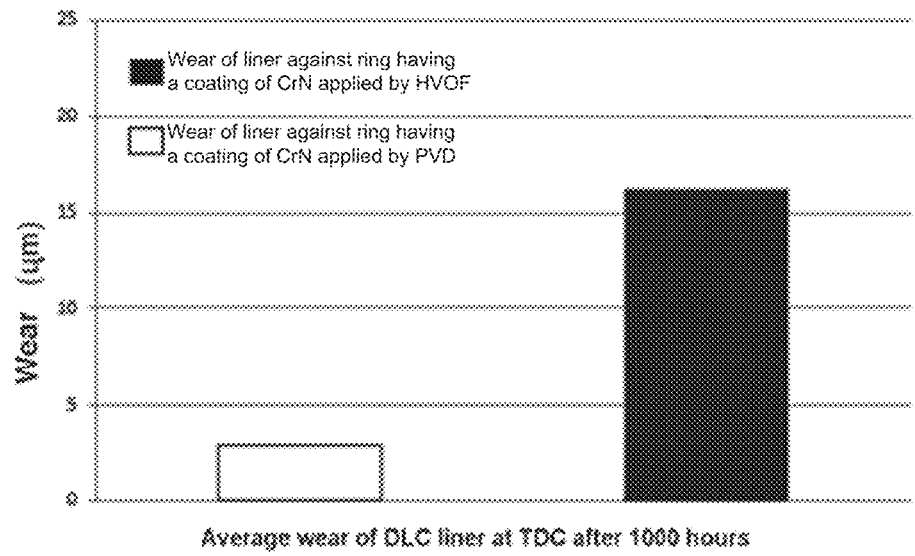
FIG. 2 is graph showing the measured wear after 1000 hours of a cylinder liner having a coating of DLC against a piston ring having a coating of chromium nitride applied by PVD and, for comparison, against a ring having a coating of chromium nitride applied by HVOF.

The graph of FIG. 2 illustrates the average wear of the cylinder liner 2 having a coating 7 of DLC, after 1000 hours, against the piston ring 4 having a coating 6 of chromium nitride applied by PVD and, for comparison, against an unspecified piston ring having a coating of chromium nitride applied by the HVOF process. The test was executed in an engine having 6 cylinders in line, wherein the linings were of pearlitic cast iron with the DLC coating.

In average figures, after 1000 hours of operation of the engine, the use of piston rings having a coating applied by HVOF gave rise to wear of the linings of approximately 16 µm at the top dead centre (TDC) position whilst the use of rings 4 having a coating of CrN applied by PVD led to the wear of the liners of identical configuration being reduced to approximately 3 µm at TDC.

Figure 3:
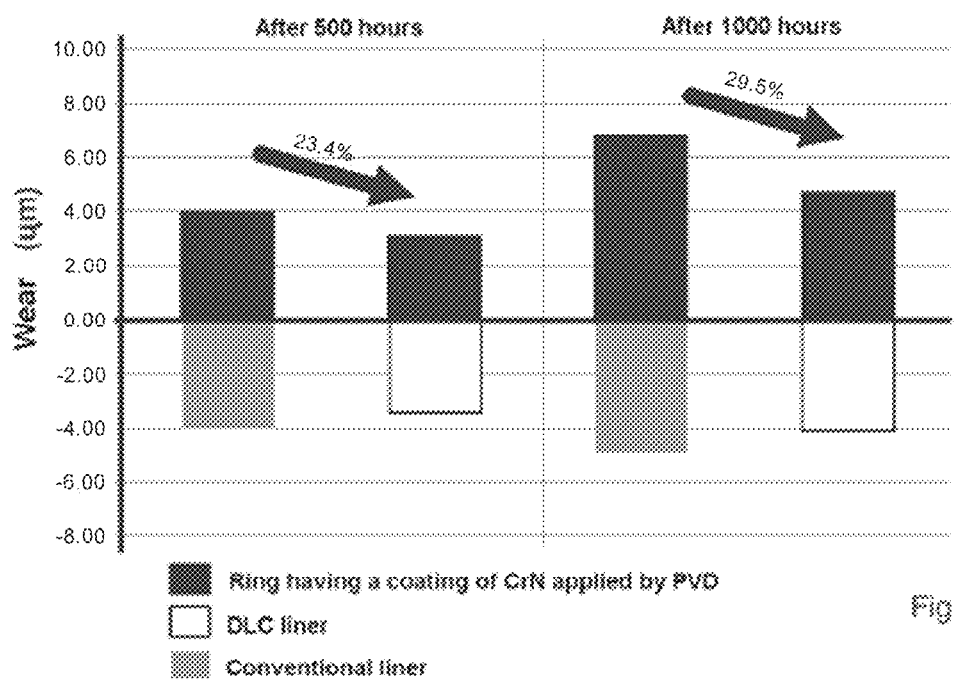
FIG. 3 is a graph showing the wear of a conventional sliding combination and the wear of the sliding combination of the present invention.

The graph of FIG. 3, in turn, shows the comparative wear between two sliding pairs, a first sliding pair being formed by a conventional liner allied with the ring 4 having a coating of CrN applied by PVD, and a second sliding pair formed by the liner having the coating of DLC allied with the ring 4 having a coating of CrN applied by PVD.

The graph illustrates wear measurements on each of the components taken after 500 hours and 1000 hours and makes it clear that, after 500 hours of testing, the combination of the present invention presented wear being 23.4% lower in comparison with the combination employing a conventional liner. After 1000 hours the results are even more advantageous, with the wear being 29.5% lower. It is sufficient to observe that the sliding combination 1 of the present invention demonstrated, after 1000 hours of testing, a degree of wear which the combination provided with the conventional liner demonstrated in half the time.

These results challenge that which is to be expected, according whereto the greater the hardness of the coating of the ring, the greater will be the wear of the liner. The result was unexpected since, as the surface hardness of the liner is increased, greater wear of the ring is to be expected, and the result obtained was surprisingly the opposite to that expected because a greater surface hardness of the liner resulted in less wear of the rings. This reduction is illustrated in the graphs of FIGS. 2 and 3, corroborating the tribological studies disclosed by the applicant.

An example of preferred embodiment having been described, it shall be understood that the scope of the present invention covers other possible variations, being solely limited by the content of the attached claims, the possible equivalents being included therein.

The invention claimed is:

1. A sliding combination for use in an internal combustion engine, comprising:
   at least one cylinder liner of cylindrical shape defining an internal sliding surface;
   a ring having at least one external lateral sliding surface, the at least one external sliding surface of the ring sliding in relation to the internal sliding surface of the at least one liner;
   the at least one external sliding surface of the ring including a first coating of a physical vapour deposited metal nitride in sliding contact with a second coating of diamond-like carbon (DLC) disposed on the internal sliding surface of the at least one liner; and
   wherein the first coating disposed on the ring has a hardness of between 1000 HV and 2300 HV, a thickness ranging from 20 µm to 40 µm, and a columnar morphology, and the second coating disposed on the at least one cylinder liner has a hardness ranging from 10 GPa to 20 GPa, a thickness ranging from 2 µm to 15 µm, and a gradient morphology.

2. The sliding combination according to claim 1, wherein the first coating disposed on the ring includes one or more of CrN, CrCN/C and TiN.

3. The sliding combination according to claim 2, wherein the first coating disposed on the ring is composed of CrN.

4. The sliding combination according to claim 1, wherein the ring has a base composed of stainless steel or cast iron.

5. The sliding combination according to claim 1, wherein the at least one liner has a metal base.

6. The sliding combination according to claim 5, wherein the metal base of the at least one liner is composed of cast iron.

7. The sliding combination according to claim 5, wherein the metal base of the at least one liner is composed of aluminium alloy.

8. The sliding combination according to claim 2, wherein the ring has a base composed of stainless steel.

9. The sliding combination according to claim 2, wherein the ring has a base composed of cast iron.

10. The sliding combination according to claim 2, wherein the at least one liner has a metal base composed of cast iron or aluminium alloy.

11. A sliding combination of an internal combustion engine, comprising:
    a cylinder liner having a cylindrical shape and defining an internal sliding surface;
    a ring having an external lateral sliding surface for sliding relative to the internal sliding surface of the cylinder liner;
    a first coating of a physical vapour deposited metal nitride disposed on the external sliding surface of the ring;
    a second coating of a diamond-like carbon (DLC) material disposed on the internal sliding surface of the cylinder liner, the second coating in sliding contact with the first coating; and
    wherein the first coating has a hardness ranging from 1000 HV to 2300 HV, a thickness ranging from 20 µm to 40 µm, and a columnar morphology, and the second coating has a hardness ranging from 10 GPa to 20 GPa, a thickness ranging from 2 µm to 15 µm, and a gradient morphology.

12. The sliding combination according to claim 11, wherein the physical vapour deposited metal nitride of the first coating has a composition including at least one of CrN, CrCN/C, and TiN.

* * * * *